US012762309B2

(12) United States Patent
Flake

(10) Patent No.: US 12,762,309 B2
(45) Date of Patent: Oct. 13, 2026

(54) METHOD AND SYSTEM FOR CLASSIFYING SCENARIOS OF A VIRTUAL TEST, AND TRAINING METHOD

(71) Applicant: dSPACE GmbH, Paderborn (DE)

(72) Inventor: Sven Flake, Detmold (DE)

(73) Assignee: dSpace GmbH, Paderborn (DE)

( * ) Notice: Subject to any disclaimer, the term of this patent is extended or adjusted under 35 U.S.C. 154(b) by 693 days.

(21) Appl. No.: 18/082,756

(22) Filed: Dec. 16, 2022

(65) Prior Publication Data

US 2023/0195977 A1 Jun. 22, 2023

(30) Foreign Application Priority Data

Dec. 21, 2021 (DE) ..................... 10 2021 133 977.4
Dec. 21, 2021 (EP) .................................... 21216234

(51) Int. Cl.
*G06F 30/27* (2020.01)
*G01M 17/007* (2006.01)

(52) U.S. Cl.
CPC ........... *G06F 30/27* (2020.01); *G01M 17/007* (2013.01)

(58) Field of Classification Search
CPC ............................. G06F 30/27; G01M 17/007
See application file for complete search history.

(56) References Cited

U.S. PATENT DOCUMENTS 10,438,371 B2 * 10/2019 Xu ....................... G06V 10/454

FOREIGN PATENT DOCUMENTS

DE 102019206908 A1 11/2020

OTHER PUBLICATIONS

Hauer, Florian et al: "Clustering Traffic Scenarios Using Mental Models as Little as Possible" IEEE Intelligent Vehicles Symposium, pp. 1007-1012, Oct. 20-23, 2020, XP033873230, DOI: 10.1109/IV47402.2020.9304636.

Xie, Jie et al: "Driving Maneuver Classification: A Comparison of Feature Extraction Methods" IEEE Sensors Journal, vol. 18, No. 12, Jun. 15, 2018, pp. 4777-4784, XP055925758, DOI: 10.1109/JSEN.2017.2780089.

Hauer, Florian et al: "Szenario-Optimierung fuer die Absicherung von automatisierten und autonomen Fahrsystemen" Arxiv.org, Cornell University Library, Jan. 17, 2019, XP081003553.

* cited by examiner

*Primary Examiner* — An H Do

(74) *Attorney, Agent, or Firm* — Muncy, Geissler, Olds & Lowe, P.C.

(57) ABSTRACT

A computer-implemented method and system for classifying scenarios of a virtual test, including a provision of a first data set of sensor data of a travel of an ego vehicle captured by a plurality of vehicle-side surroundings detection sensors; a transformation of the first data set of sensor data into a data-reduced second data set of sensor data by a first algorithm, in particular a multivariate data analysis method; an application of a second machine learning algorithm to the data-reduced second data set of sensor data for classifying scenarios comprised by the second data set; and an output of a third data set having a plurality of classes representing a vehicle action. Provided is also a computer-implemented method for providing a trained second machine learning algorithm for classifying scenarios of a virtual test.

16 Claims, 2 Drawing Sheets

METHOD AND SYSTEM FOR CLASSIFYING SCENARIOS OF A VIRTUAL TEST, AND TRAINING METHOD

This nonprovisional application claims priority under 35 U.S.C. § 119(a) to German Patent Application No. 10 2021 133 977.4, which was filed in Germany on Dec. 21, 2021, and to European Patent Application 21216234, which was filed in Europe on Dec. 21, 2021, and which are both herein incorporated by reference.

BACKGROUND OF THE INVENTION

Field of the Invention

The present invention relates to a computer-implemented method for classifying scenarios of a virtual test. The present invention further relates to a computer-implemented method for providing a trained second machine learning algorithm for classifying scenarios of a virtual test. The invention additionally relates to a system for classifying scenarios of a virtual test.

Description of the Background Art

Driver assistance systems, e.g., an adaptive speed controller and/or functions for highly automated driving, may be verified and validated with the aid of various checking mechanisms. Simulations, in particular, may be used.

To create test scenarios for simulations, it is necessary to carry out test drives. The sensor data obtained hereby are then abstracted into a logical scenario. Input data are raw data, i.e., sensor data from real measurement drives in the sense of recordings of radar echoes, 3D point clouds from LIDAR measurements, and image data. Result data are simulatable driving scenarios, which comprise surroundings, on the one hand, and trajectories, on the other hand. Driving maneuvers are subsequently categorized in groups.

"Szenario-Optimierung für die Absicherung von automatisierten and autonomen Fahrsystemen" (Scenario Optimization for Validating Automated and Autonomous Driving Systems) (Florian Hauer, B. Holzmüller, 2019) discloses methods for verifying and validating automated and autonomous driving systems, in particular coming up with suitable test scenarios for virtual validation.

The test methodology provides for the adaptation of a metaheuristic search for the purpose of optimizing scenarios. An appropriate search space and a suitable power function must be established for this purpose. Parameterized scenarios are derived, based on an abstract description of the functionality and applications of the system.

The parameters thereof span a search space, from which the appropriate scenarios are to be identified. However, generating scenarios is computationally intensive. As a result, there is interest in minimizing the number of generation operations and in limiting them to relevant scenarios. For example, relevant scenarios comprise scenarios which are not yet available as simulatable scenarios, or not in sufficient quantity.

Generating these scenarios is computationally intensive. A generation time generally corresponds to a recorded driving time. A computing effort is furthermore based on a quantity and complexity of generated scenarios.

For both reasons, there is an interest in minimizing the number of generation operations and in limiting them to relevant scenarios. For example, relevant scenarios comprise scenarios which are not yet available as simulatable scenarios, or not in sufficient quantity.

As a result, there is a need to improve existing methods for classifying scenarios of a virtual test in such a way that an identification of relevant scenarios is made possible using fewer computing resources.

SUMMARY OF THE INVENTION

It is therefore an object of the present invention to provide a more efficient method for classifying scenarios of a virtual test.

According to an exemplary embodiment of the invention, the object is achieved by a computer-implemented method for classifying scenarios of a virtual test. According to invention, the object is also achieved by a computer-implemented method for classifying scenarios of a virtual test. Also, the object is further achieved by a system for classifying scenarios of a virtual test. The object is additionally achieved by a computer program including program code for carrying out the method according to the invention when the computer program is executed on a computer.

The invention relates to a computer-implemented method for classifying scenarios of a virtual test. The method comprises a provision of a first data set of sensor data of a travel of an ego vehicle captured by a plurality of vehicle-side surroundings detection sensors.

In general the term "ego vehicle" can represent a virtual vehicle in the center of a simulation or a test. E.g. the vehicle for that a new function is to be developed or tested. Typically, one skilled in the art uses such to distinguish a central vehicle ("ego") from other vehicles or traffic participants (pedestrians, bicycles, etc.) that are usually called "fellows" or "fellow vehicles" that appear in a simulation or test and can interact or have an impact on the ego. For example, there may be several vehicles in a scenario in order to test a function of the ego vehicle but these fellow vehicles may not have the function to be tested (e.g. automatic braking systems.

The method further comprises a transformation of the first data set of sensor data into a data-reduced second data set of sensor data by a first algorithm, in particular a multivariate data analysis method.

The method additionally comprises an application of a second machine learning algorithm to the data-reduced second data set of sensor data for classifying scenarios comprised by the second data set, and an output of a third data set having a multiplicity of classes representing a vehicle action.

The output of a third data set having a multiplicity of classes representing a vehicle action relates to the classification result output by the second machine learning algorithm.

The invention also relates to a computer-implemented method for providing a trained second machine learning algorithm for classifying scenarios of a virtual test. The method comprises a receipt of a data-reduced second data set of sensor data transformed by a first algorithm, in particular a multivariate data analysis method, based on a first data set of sensor data of a travel of an ego vehicle captured by a plurality of vehicle-side surroundings detection sensors.

The method additionally comprises a receipt of a third data set having a plurality of classes representing a vehicle action, and a training of the second machine learning algorithm by an optimization algorithm, which calculates an extreme value of a loss function for classifying scenarios of a virtual test.

The invention furthermore relates to a system for classifying scenarios of a virtual test. The system includes a plurality of vehicle-side surroundings detection sensors for providing a first data set of sensor data of a captured travel of an ego vehicle.

The system further includes a transformer for transforming the first data set of sensor data into a data-reduced second data set of sensor data by a first algorithm, in particular a multivariate data analysis process.

The system also includes an applicator for applying a second machine learning algorithm to the data-reduced second data set of sensor data for classifying scenarios comprised by the second data set, the applicator being configured to output a third data set having a plurality of classes representing a vehicle action.

An idea of the present invention is to estimate a category of a driven scenario, based on reduced sensor raw data, without having to use the actual generation process. An estimator of this type may thus be advantageously employed to select raw data sets in advance, for which a generation of simulatable scenarios is useful.

The sensor raw data are made up of a large volume of data for each data set, since the data of different sensors, such as radar, LIDAR, or a camera, are typically measured over a driving period. Relevant data of a sensor in the sense of machine learning are also referred to as features. In an image, for example, each individual pixel is a feature of this type. At the same time, typical features within the individual sensor types are to be calculated with a high correlation.

The estimator itself is a nonlinear estimator in the form of a neural network, due to the complexity of the sensor data. The neural network is first trained based on the raw data reduction and affects the estimation later on, also based on the reduction. The estimator, or the second machine learning algorithm, becomes fast or efficient precisely due to this previous reduction of the dimension of the training data by the multivariate data analysis process.

Machine learning algorithms are based on the fact that statistical methods are used to train a data processing system in such a way that it may carry out a certain task without the latter having to be originally explicitly programmed for that purpose. The goal of machine learning is to construct algorithms which may learn from data and make predictions. These algorithms create mathematical models, with the aid of which, for example, data may be classified.

Those skilled in the art understand a data-reduced data set or a dimension-reduced feature representation to be the transformation of data from a high-dimensional space into a low-dimensional space, so that the low-dimensional representation or the representation having a smaller data volume retains some useful properties of the original data, ideally close to their intrinsic dimension.

The factor analysis is a multivariate statistical method. It is used to infer a few underlying latent variables ("factors") from many different manifest variables (observables, statistical variables).

The correspondence analysis is a multivariate statistical method, with the aid of which the relationships of the variables of a contingency table are represented graphically. The column and row profiles of a matrix are represented by points in a space, whose coordinate axes are formed by the particular features. It is also referred to as a principle component analysis using categorical data.

The principle component analysis is a multivariate statistical method. It structures comprehensive data sets by using the eigenvectors of the covariance matrix. Data sets may be simplified and exemplified thereby, in that a multiplicity of statistical variable are approximated by a smaller number of the most meaningful linear combinations possible (the principle components).

The plurality of vehicle-side surroundings detection sensors can include an essentially identical field of vision in sections, a data set of a first surroundings detection sensor, a data set of a second surroundings detection sensor, and a data set of a third surroundings detection sensor comprising at least one same object. The same objects may thus be advantageously captured simultaneously by the plurality of surroundings detection sensors.

The first surroundings detection sensor can be a radar sensor, the second surroundings detection sensor can be a LIDAR sensor, and the third surroundings detection sensor can be a camera sensor.

Obstacles on the street are registered, for example, by all three sensors used, i.e., radar, LIDAR, and camera sensors, even if they do so in different ways, namely by a radar echo, by the characteristics of the points in a 3D point cloud, and by representation in an image.

The present invention uses this to reduce the data volume in a first step. A multivariate analysis method, in particular the principle component analysis, is used for this purpose. Individual features (such as "distance to the object" in the "radar" and "LIDAR" versions) are combined into one feature ("distance to the object" in general). This combination is learned by the principle component analysis and does not have to be carried out manually.

The result obtained is a greatly reduced data set, in which the correlating data are combined in a simplified manner. Since the size of the individual data sets, i.e., the number of features, is a crucial factor for the amount of time required to train estimators, this step permits a significantly more efficient training of an estimator in the second step.

The first algorithm can carry out a factor analysis method, a principle component analysis method, and/or a correspondence analysis method. The best possible data analysis method is used, depending on the intended purpose.

The principle component analysis method combines correlating first features of the plurality of vehicle-side surroundings detection sensors into a single data-reduced feature as a linear combination of values of the plurality of vehicle-side surroundings detection sensors.

For example, raw data of radar, LIDAR, and camera sensors occur during a measurement drive. The features, i.e., input data for the scenario generation from measured data, are radio echoes, point clouds, and image pixels, which in total represents a large volume of data. If an obstacle is detected, the obstacle is reflected in the type of radar echoes, in the distance of the points in a point cloud to the sensor, as well as in the form of obstacles in the video image in the direction of travel.

An obstacle thus appears in all three sensors—the sensor data therefore correlate in the case of a situation of this type.

The principle component analysis reveals correlations of this type and combines these three features (mathematically as a linear combination of the values of the radar echoes, point clouds, and pixels) into one general feature. This feature then further reflects the information of "obstacle."

Due to this data reduction, the estimating neural network in this example makes do with one feature (of the linear combination) instead of three features (radar echo data, point clouds, and pixels) in order to be trained and to make decisions. Since at least two sensors generally supply correlating information, a high reduction rate is to be expected.

The second machine learning algorithm can be an artificial neural network, a size of an input layer being given by a number of second features of the data-reduced second data set, and a size of an output layer being given by a number of classes.

The second machine learning algorithm is a nonlinear classifier in the form of the artificial neural network and advantageously takes on the task of estimating a scenario category. The reduction of the raw data is used as the input and the category as the output.

A size of the input layer of the artificial neural network may be identical to a size of the output layer of the artificial neural network.

The size of the input layer or entry layer is given by the features of the reduced sensor data. The size of the output layer is defined by the number of available scenario categories. A multiclass classification is used here, in which the neural network calculates a probability for each scenario category and selects the category having the highest probability as a prediction.

A number of hidden layers of the artificial neural network may be smaller than the size of the input layer of the artificial neural network and the size of the output layer of the artificial neural network.

As a result, it is sufficient to equip the estimating neural network with substantially less input data and consequently substantially fewer hidden neurons in the hidden layers, which significantly reduces the training effort with respect to the necessary computing power.

Since the pieces of information are correlated, the network may nevertheless be trained to predict a scenario category, similarly to an estimator, which determines this for a finished scenario.

As a result, before applying a generation of a scenario or scenarios from measured data, it is possible to predict which category the scenario with have and, based on this decision, the application of the scenario generation from measured data may be assessed and thus also an amount of computing time.

The second machine learning algorithm can carry out a multiclass classification, in which a probability is calculated for each class, and the class having the highest probability is selected as a prediction. An accurate classification of particular scenarios contained in the data sets may thus be advantageously made possible.

A fourth data set having a logical scenario can be generated, based on the selected class representing the vehicle action. The logical scenario may thus be advantageously generated in a targeted manner and with a reduce computing effort.

The plurality of classes representing the vehicle action can comprise at least one value of an acceleration operation, a braking operation, a change in direction and/or lane, a travel at a constant speed of the ego vehicle, a lane ID, and/or a time- or location-related condition for carrying out a vehicle action.

Particular classes representing a vehicle action may further be the following, for example: A following behavior of vehicles, the preceding vehicle braking hard; one vehicle cutting closely in front of another vehicle; pulling onto a larger street with flowing traffic; a vehicle turning at an intersection and crossing paths with another vehicle; a vehicle turning at an intersection and interacting with a pedestrian who is crossing the street; driving along a street being crossed by a pedestrian; driving along a street where a pedestrian is walking in/against the direction of travel; driving along a street where a bicyclist is riding in/against the direction of travel; and/or avoiding an obstacle on the street.

It can also be provided that, for the purpose of transforming the first data set of sensor data into a data-reduced second data set of sensor data, the first algorithm, in particular the multivariate data analysis method, comprises a standardization of the first data set of sensor data of a travel of the ego vehicle captured by the plurality of vehicle-side surroundings detection sensors; a calculation of a covariance matrix from the standardized first data set, a determination of eigenvectors representing principle components, and a creation of a matrix from the determined eigenvectors for providing a data-reduced second data set.

A multivariate data analysis method may thus be advantageously provided for reducing the raw data of the sensor data.

The features of the method described herein for classifying scenarios of a virtual test are likewise applicable to the system for classifying scenarios of a virtual test and vice versa.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
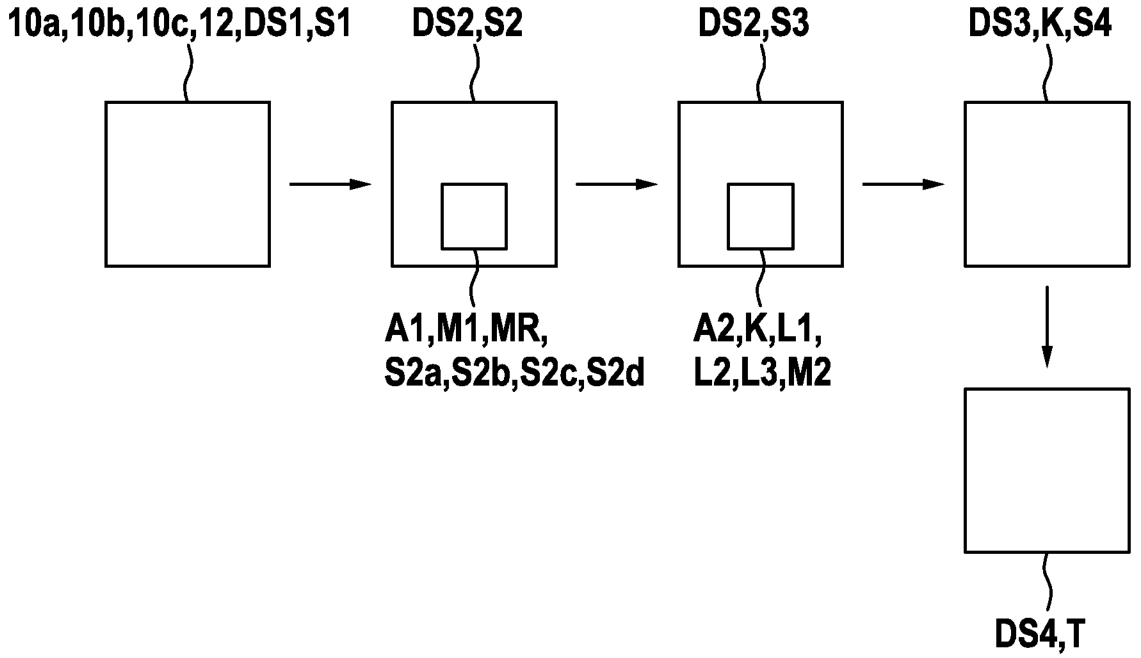
FIG. 1 shows a flowchart of a computer-implemented method for classifying scenarios of a virtual test according to one preferred specific embodiment of the invention.

The method shown in FIG. 1 for classifying scenarios of a virtual test T comprises a provision S1 of a first data set DS1 of sensor data of a travel of an ego vehicle 12 captured by a plurality of vehicle-side surroundings detection sensors 10*a*, 10*b*, 10*c*.

The method further comprises a transformation S2 of first data set DS1 of sensor data into a data-reduced second data set DS2 of sensor data by a first algorithm A1, in particular a multivariate data analysis method.

The method additionally comprises an application S3 of a second machine learning algorithm A2 to data-reduced second data set DS2 of sensor data for classifying scenarios comprised by second data set DS2, and an output S4 of a third data set DS3 having a multiplicity of classes K representing a vehicle action.

The plurality of vehicle-side surroundings detection sensors 10_a_, 10_b_, 10_c_ have an essentially identical field of vision in sections. A data set of a first surroundings detection sensor 10_a_, a data set of a second surroundings detection sensor 10_b_, and a data set of a third surroundings detection sensor 10_c_ comprise at least one same object.

First surroundings detection sensor 10_a_ is formed by a radar sensor, second surroundings detection sensor 10_b_ is formed by a LIDAR sensor, and third surroundings detection sensor 10_c_ is formed by a camera sensor.

First algorithm A1 preferably carries out a principle component analysis method. Alternatively, first algorithm A1 may carry out, for example, a factor analysis method and/or a correspondence analysis method.

The principle component analysis method combines correlating first features M1 of the multiplicity of vehicle-side surroundings detection sensors 10_a_, 10_b_, 10_c_ into a single data-reduced feature MR as a linear combination of values of the multiplicity of vehicle-side surroundings detection sensors 10_a_, 10_b_, 10_c_.

Second machine learning algorithm A2 is formed by an artificial neural network. A size of an input layer L1 is given by a number of second features M2 of data-reduced second data set DS2. A size of an output layer L3 is given by a number of classes K.

A size of input layer L1 of the artificial neural network is identical to a size of output layer L3 of the artificial neural network. A number of hidden layers L2 of the artificial neural network is smaller than the size of input layer L1 of the artificial neural network and the size of output layer L3 of the artificial neural network.

Second machine learning algorithm A2 carries out a multiclass classification, in which a probability is calculated for each class K, and class K having the highest probability is selected as a prediction.

A fourth data set DS4 including a logical scenario, is generated based on selected class K representing the vehicle action.

The plurality of classes K representing the vehicle action comprises at least one value of an acceleration operation, a braking operation, a change in direction and/or lane, a travel at a constant speed of ego vehicle 12, a lane ID, and/or a time- or location-related condition for carrying out a vehicle action.

First algorithm A1, in particular the multivariate data analysis method, for transforming first data set DS1 of sensor data into a data-reduced second data set DS2 of sensor data comprises a standardization S2_a_ of first data set DS1 of sensor data of a travel of ego vehicle 12 captured by the plurality of vehicle-side surroundings detection sensors 10_a_, 10_b_, 10_c_.

First algorithm A1 further comprises a calculation S2_b_ of a covariance matrix from standardized first data set DS1, a determination S2_c_ of eigenvectors representing principle components, and a creation S2_d_ of a matrix from the determined eigenvectors for providing a data-reduced second data set DS2.

Figure 2:
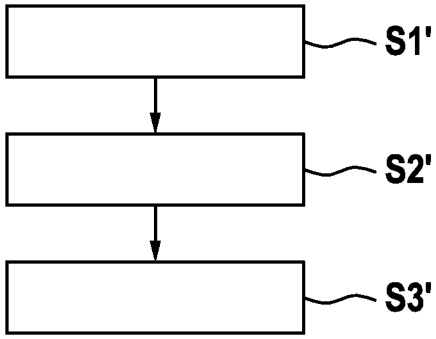
FIG. 2 shows a flowchart of a computer-implemented method for providing a trained second machine learning algorithm for classifying scenarios of a virtual test according to the preferred specific embodiment of the invention.

FIG. 2 shows a flowchart of a computer-implemented method for providing a trained second machine learning algorithm A2 for classifying scenarios of a virtual test T according to the preferred specific embodiment of the invention.

The method comprises a receipt S1' of a data-reduced second data set DS2 of sensor data transformed by a first algorithm A1, in particular a multivariate data analysis method, based on a first data set DS1 of sensor data of a travel of an ego vehicle 12 captured by a plurality of vehicle-side surroundings detection sensors 10_a_, 10_b_, 10_c_.

The method additionally comprises a receipt S2' of a third data set DS3 having a plurality of classes K representing a vehicle action, and a training S3' of second machine learning algorithm A2 by an optimization algorithm, which calculates an extreme value of a loss function for classifying scenarios of a virtual test T.

Figure 3:
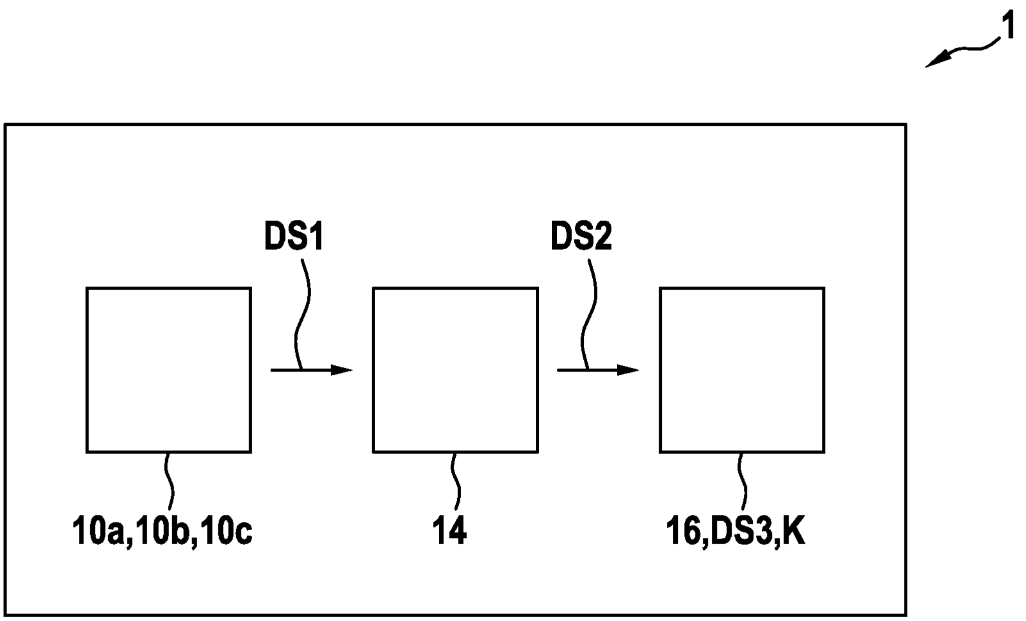
FIG. 3 shows a schematic representation of a system for classifying scenarios of a virtual test according to the preferred specific embodiment of the invention.

FIG. 3 shows a schematic representation of a system 1 for classifying scenarios of a virtual test T according to the preferred specific embodiment of the invention.

System 1 includes a plurality of vehicle-side surroundings detection sensors 10_a_, 10_b_, 10_c_ for providing a first data set DS1 of sensor data of a captured travel of an ego vehicle 12.

System 1 additionally includes a transformer 14 for transforming first data set DS1 of sensor data into a data-reduced second data set DS2 of sensor data by a first algorithm A1, in particular a multivariate data analysis method.

System 1 further includes an applicator 16 for applying a second machine learning algorithm A2 to data-reduced second data set DS2 of sensor data for classifying scenarios comprised by second data set DS2, the applicator 16 being configured to output a third data set DS3 having a plurality of classes K representing a vehicle action.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A computer-implemented method for classifying scenarios of a virtual test, the method comprising:

providing a first data set of sensor data of a travel of an ego vehicle captured by a plurality of vehicle-side surroundings detection sensors;

transforming the first data set of sensor data into a single data-reduced second data set of sensor data, including the sensor data from each of the plurality of vehicle-side surroundings detection sensors, by a first algorithm or a multivariate data analysis method;

applying a second machine learning algorithm to the data-reduced second data set of sensor data for classifying scenarios comprised by the second data set; and outputting a third data set having a plurality of classes representing a vehicle action, wherein the first algorithm carries out a principle component analysis method, and wherein the principle component analysis method combines correlating first features of the plurality of vehicle-size surroundings detection sensors into a single data-reduced feature as a linear combination of values of the plurality of surroundings detection sensors.

2. The computer-implemented method according to claim 1, wherein the plurality of vehicle-side surroundings detection sensors includes an essentially identical field of vision in sections, a data set of a first surroundings detection sensor, a data set of a second surroundings detection sensor, and a data set of a third surroundings detection sensor comprising at least one same object.

3. The computer-implemented method according to claim 2, wherein the first surroundings detection sensor is formed by a radar sensor, the second surroundings detection sensor is formed by a LIDAR sensor, and the third surroundings detection sensor is formed by a camera sensor.

4. The computer-implemented method according to claim 1, wherein the first algorithm further carries out a factor analysis method and/or a correspondence analysis method.

5. The computer-implemented method according to claim 1, wherein the second machine learning algorithm is formed by an artificial neural network, a size of an input layer being given by a number of second features of the data-reduced second data set, and a size of an output layer being given by a number of classes.

6. The computer-implemented method according to claim 5, wherein a size of the input layer of the artificial neural network is identical to a size of the output layer of the artificial neural network.

7. The computer-implemented method according to claim 6, wherein a number of hidden layers of the artificial neural network is smaller than the size of the input layer of the artificial neural network and the size of the output layer of the artificial neural network.

8. The computer-implemented method according to claim 1, wherein the second machine learning algorithm carries out a multiclass classification, in which a probability is calculated for each class, and wherein the class having the highest probability is selected as a prediction.

9. The computer-implemented method according to claim 8, wherein a fourth data set having a logical scenario is generated based on the selected class representing the vehicle action.

10. The computer-implemented method according to claim 1, wherein the plurality of classes representing the vehicle action comprises at least one value of an acceleration operation, a braking operation, a change in direction and/or lane, a travel at a constant speed of the ego vehicle, a lane ID, and/or a time- or location-related condition for carrying out a vehicle action.

11. The computer-implemented method according to claim 1, wherein, for the purpose of transforming the first data set of sensor data into a data-reduced second data set of sensor data, the first algorithm or the multivariate data analysis method comprises:
- a standardization of the first data set of sensor data of a travel of the ego vehicle captured by the plurality of vehicle-side surroundings detection sensors;
- a calculation of a covariance matrix from the standardized first data set;
- a determination of eigenvectors representing principle components; and
- a creation of a matrix made up of the determined eigenvectors for providing a data-reduced second data set.

12. A computer program including program code for carrying out the method according to claim 1 when the computer program is executed on a computer.

13. A non-transitory computer-readable storage medium including program code for carrying out the method according to claim 1 when executed on a computer.

14. The computer-implemented method according to claim 1, wherein the single data-reduced second data set includes a linear combination of values of the plurality of vehicle-side surroundings detection sensors.

15. A computer-implemented method for providing a trained second machine learning algorithm for classifying scenarios of a virtual test, the method comprising:
- receiving a single data-reduced second data set of sensor data, including the sensor data from each of the plurality of vehicle-side surroundings detection sensors, transformed by a first algorithm or a multivariate data analysis method based on a first data set of sensor data of a travel of an ego vehicle captured by a plurality of vehicle-side surroundings detection sensors;
- receiving a third data set having a plurality of classes representing a vehicle action; and
- training the second machine learning algorithm by an optimization algorithm, which calculates an extreme value of a loss function for classifying scenarios of a virtual test,
- wherein the first algorithm carries out a principle component analysis method, and
- wherein the principle component analysis method combines correlating first features of the plurality of vehicle-size surroundings detection sensors into a single data-reduced feature as a linear combination of values of the plurality of surroundings detection sensors.

16. A system for classifying scenarios of a virtual test, the system comprising:
- a plurality of vehicle-side surroundings detection sensors to provide a first data set of sensor data of a captured travel of an ego vehicle;
- a transformer to transform the first data set of sensor data into a single data-reduced second data set of sensor data, including the sensor data from each of the plurality of vehicle-side surroundings detection sensors, by a first algorithm or a multivariate data analysis method;
- an applicator to apply a second machine learning algorithm to the data-reduced second data set of sensor data for classifying scenarios comprised by the second data set, the applicator being configured to output a third data set having a plurality of classes representing a vehicle action,
- wherein the first algorithm carries out a principle component analysis method, and
- wherein the principle component analysis method combines correlating first features of the plurality of vehicle-size surroundings detection sensors into a single data-reduced feature as a linear combination of values of the plurality of surroundings detection sensors.

* * * * *